(12) United States Patent
Fromson et al.

(10) Patent No.: US 7,700,266 B2
(45) Date of Patent: Apr. 20, 2010

(54) WATER SPRAY DEVELOPMENT OF PLANOGRAPHIC PLATES

(75) Inventors: Howard A. Fromson, Stonington, CT (US); William J. Ryan, North Granby, CT (US); William J. Rozell, Simpsonville, SC (US); Paul A. Perron, Springfield, MA (US)

(73) Assignee: Anocoil Corporation, Rockville, CT (US)

( * ) Notice: Subject to any disclaimer, the term of this patent is extended or adjusted under 35 U.S.C. 154(b) by 0 days.

(21) Appl. No.: 11/821,721

(22) Filed: Jun. 25, 2007

(65) Prior Publication Data

US 2008/0318163 A1    Dec. 25, 2008

(51) Int. Cl.
*G03F 7/26* (2006.01)
(52) U.S. Cl. .................... 430/302; 101/463.1
(58) Field of Classification Search ........... None
See application file for complete search history.

(56) References Cited

U.S. PATENT DOCUMENTS

| | | | | |
|---|---|---|---|---|
| 3,891,439 A | * | 6/1975 | Katz et al. | 430/331 |
| 4,612,276 A | * | 9/1986 | Browne | 430/302 |
| 5,223,041 A | * | 6/1993 | Cerney | 134/15 |
| 5,252,431 A | * | 10/1993 | Yoshida et al. | 430/303 |
| 2004/0221876 A1 | * | 11/2004 | Waleh et al. | 134/30 |
| 2007/0172765 A1 | * | 7/2007 | Teng | 430/302 |

* cited by examiner

*Primary Examiner*—Cynthia H Kelly
*Assistant Examiner*—Chanceity N Robinson
(74) *Attorney, Agent, or Firm*—Alix, Yale & Ristas, LLP

(57) ABSTRACT

Excellent development of planographic printing plates can be achieved by exposing an imaged, negative working, photo-polymerizable coating to a high pressure stream of essentially untreated tap water, whereby the water completely removes only the less cohesive and adhesive (e.g., partially polymerized) regions to the substrate, thereby directly producing a printing plate having an image pattern of highly cohesive and adhesive, oleophilic regions of the coating and hydrophilic regions of the substrate. The coating removal mechanism appears to be due entirely to ablation. The high pressure stream is preferably delivered to the plate through at least one nozzle having a discharge pressure greater than about 200 psi. Each nozzle preferably has a spray pattern that impinges the plate over a substantially rectangular region of the plate, and the nozzle and plate translate relative to each other. The nozzle can reciprocate across the width of a longitudinally transported plate, thereby contacting successive regions of the plate in a rastering fashion.

8 Claims, 4 Drawing Sheets

WATER SPRAY DEVELOPMENT OF PLANOGRAPHIC PLATES

RELATED APPLICATION

This application claims priority under 35 U.S.C. §120 from U.S. Provisional Application No. 60/704,140 filed Jul. 29, 2005, for "Imageable Printing Plate for On-Press Development" and U.S. patent application Ser. No. 11/493,183 filed Jul. 26, 2006 for "Imageable Printing Plate for On-Press Development."

BACKGROUND

The present invention relates to the development of imaged lithographic plates, and especially to such plates as used for printing.

Plates of this type have a radiation-sensitive, oleophilic polymer resin coating on a hydrophilic substrate. Imaging at ultraviolet, visible, or infrared wavelengths produces regions of differential solubility. The plates are developed to remove the more soluble regions of the coating, thereby producing a substantially planographic pattern of oleophilic and hydrophilic regions. The developed plates are then ready for mounting on a cylinder of a printing press, where the plates are subjected to fountain fluid and ink for transfer of ink to a target surface according to the pattern of oleophilic and hydrophilic regions on the plate. Historically, the processing of plates involves immersion of the plate in a sump of developer as the plate passes through a plate processor. The plate then exits the sump, and is typically subjected to a rotating brush or molleton and a nip roll set prior to being rinsed. This method of development relies entirely on chemical dissolution. In an ideal imaged plate, the relatively insoluble regions experience little dissolution over a wide range of immersion dwell time in the developer solution, whereas over the same wide range of dwell time the relatively soluble regions quickly and completely dissolve.

In practice, this ideal is not achievable, because the developer solution chemistry, temperature, and dwell time must be traded off to optimize cleanout of background while retaining the small dots of coating that provide good highlights in the printed product. Such optimization typically requires that the developer solution be strongly reactive and the dwell time be of long enough duration, to dissolve all the background, while conditioning agents in the developer solution, such as surfactants, help protect the relatively insoluble regions of the coating from reacting with the reactive ingredient of the developer solution.

Solubility differences associated with developing latitude correlate with differences in cohesion (the degree to which coating material "sticks" to itself and adhesion (the degree to which coating material "sticks" to the substrate).

SUMMARY OF THE INVENTION

We have discovered that excellent development can be achieved by exposing the entire imaged coating to a high pressure stream of developing liquid, preferably essentially untreated tap water, whereby the liquid completely removes only the less cohesive and adhesive regions from the substrate, thereby directly producing a printing plate having an image pattern of highly cohesive and adhesive, oleophilic regions of the coating and hydrophilic regions of the substrate.

In general, the highly cohesive and adhesive coating regions are highly polymerized and the less cohesive and adhesive coating regions are significantly less (relatively partially) polymerized. The high pressure liquid completely removes only the unimaged, partially polymerized regions from the substrate, directly producing a printing plate having an image pattern of highly polymerized, oleophilic regions of the coating and hydrophilic regions of the substrate.

The coating removal mechanism appears to be due entirely to ablation.

At least one nozzle discharges the developer liquid at a discharge pressure and the discharged liquid impinges the plate at a contact pressure that is commensurate with the discharge pressure. With the nozzle spaced above the plate at a working distance, the plate and/or nozzle translate relative to each other in a process direction at a substantially constant average speed. The discharge pressure, nozzle spacing, and average speed are selected such that the high pressure stream of liquid has impinged and developed the entire plate surface with a throughput speed in the range of 3-6 ft/min.

The high pressure stream is preferably delivered to the plate through at least one nozzle having a discharge pressure greater than about 200 psi, and preferably greater than about 500 psi. Each nozzle preferably has a spray pattern that impinges the plate over a substantially rectangular area (subarea) of the plate, with relative movement between the nozzle and the plate until the entire area of the plate has been developed. The nozzle can reciprocate across the width of a longitudinally transported plate, thereby contacting successive subareas of the plate in a rastering fashion.

The method is especially effective with negative working plates having a solvent soluble, photopolymerizable coating. In these plates, the adhesion and cohesion of the regions exposed to radiation imaging is much stronger that the adhesion and cohesion in the unexposed regions. This difference renders the unexposed regions much more susceptible to essentially pure mechanical removal, i.e., via ablation. Although the unexposed coating could readily be solubilized by a conventional solvent based developer solution, highly pressurized tap water according to the present disclosure provides no solvent, so coating dissolution cannot even be an initiating mechanism for coating removal.

We have found that negative working newspaper plates can be developed within a commercially acceptable time interval using tap water at room temperature, when a nozzle discharges water at a pressure over 200 psi, preferably over 500 psi, with a diverging spray pattern having a length of 2 to 6 inches and a width of less than one inch at contact with the plate, while the nozzle remains 1 to 4 inches above the plate.

Another embodiment is directed to a processor comprising a rigid surface for supporting a plate to be developed, a pump having an inlet fluidly connectable to a source of developing liquid and operable to discharge the liquid through an outlet at a pressure of at least about 200 psi, a delivery line connectable to the outlet, and at least one nozzle fluidly connected to the delivery line. A wand or the like is connected to the nozzle, by which the nozzle can be aimed at a plate when supported by the rigid surface and deliver a high pressure stream of liquid onto the coating of the plate.

In one variation, the wand is a rod for manually aiming a single nozzle. Such wand can be a rigid pipe or tube connected between the delivery line and the nozzle, or a solid rod or handle projecting from the nozzle body or a tube upstream of the nozzle body.

In another variation, the wand is fixed in a frame located above the rigid support. The wand can include a track or other means for reciprocating the nozzle transversely to a continually (intermittent or continuously) conveyed plate, preferably in a rastering fashion.

A significant advantage of the invention is that there is little or no chemical treatment required of the waste stream associated with developing the plate. Another significant advantage is that because dissolution of the polymer resin is not relied upon for processing the plate, higher molecular weight resins can be used in the coating, thereby producing more durable oleophilic regions and longer plate life on press. Yet another advantage is that with the preferred rastering motion of the nozzle, the removed coating is carried away off the sides of the plates, thereby avoiding redeposition on the substrate.

Another advantage is that excess dwell time (time a given point on the coating is subjected to the development fluid) is of little or no consequence. The regions of low cohesion and adhesion in a given area of the coating clean out completely within a few seconds, whereas the regions of high cohesion and adhesion in that same given area can tolerate the high pressure for much a longer time, e.g., minutes. This difference means that careful determination and control of nozzle flow rate and dwell time windows are not needed. This differs from one of our previous inventions, in which a spray of chemically reactive developer solution is applied as a continual flow of fresh developer solution onto each unit area of the coated plate for a local dwell time of less than about 10 seconds, and then immediately removed to avoid excess developer solution dwell time on the highly polymerized but still slightly soluble image regions.

DETAILED DESCRIPTION

Figure 1:
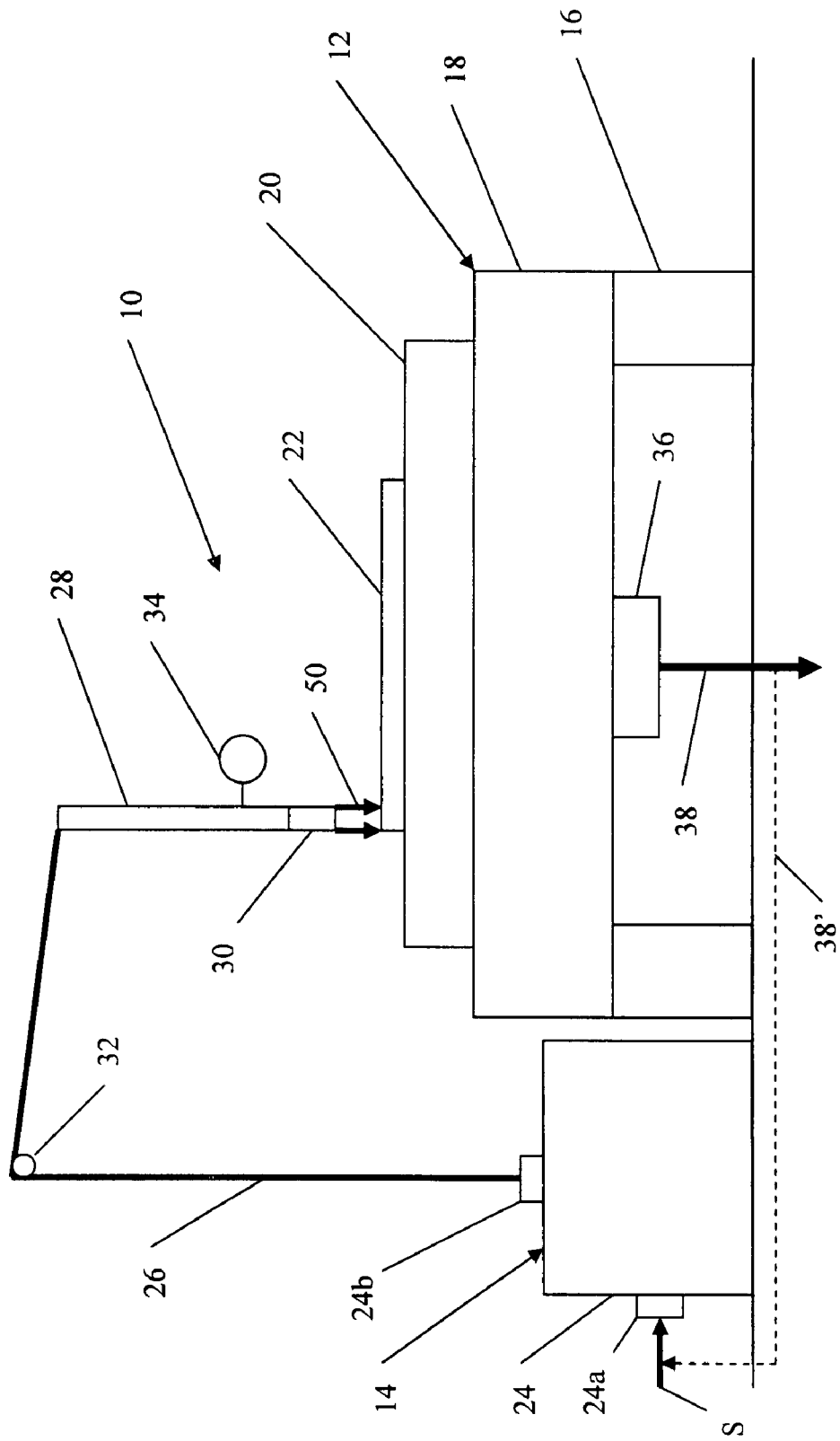
FIG. 1 is a schematic representation of equipment for implementing a basic embodiment of the invention with a manually directed spray nozzle.
Figure 2:
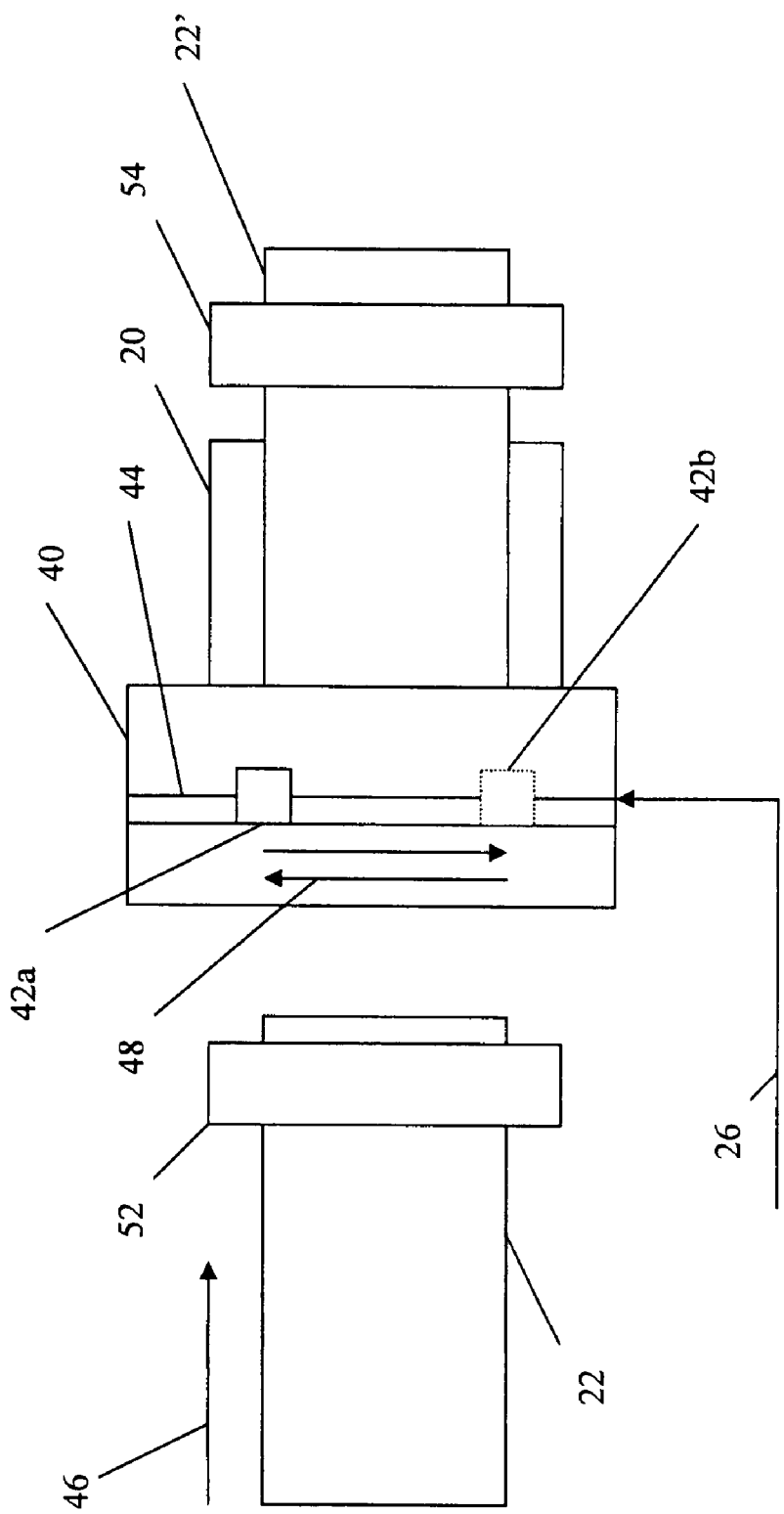
FIG. 2 is a schematic top view of a processor according to another embodiment, having an automatic spray nozzle situated above and movable transversely with respect to a conveyed plate.
Figure 3:
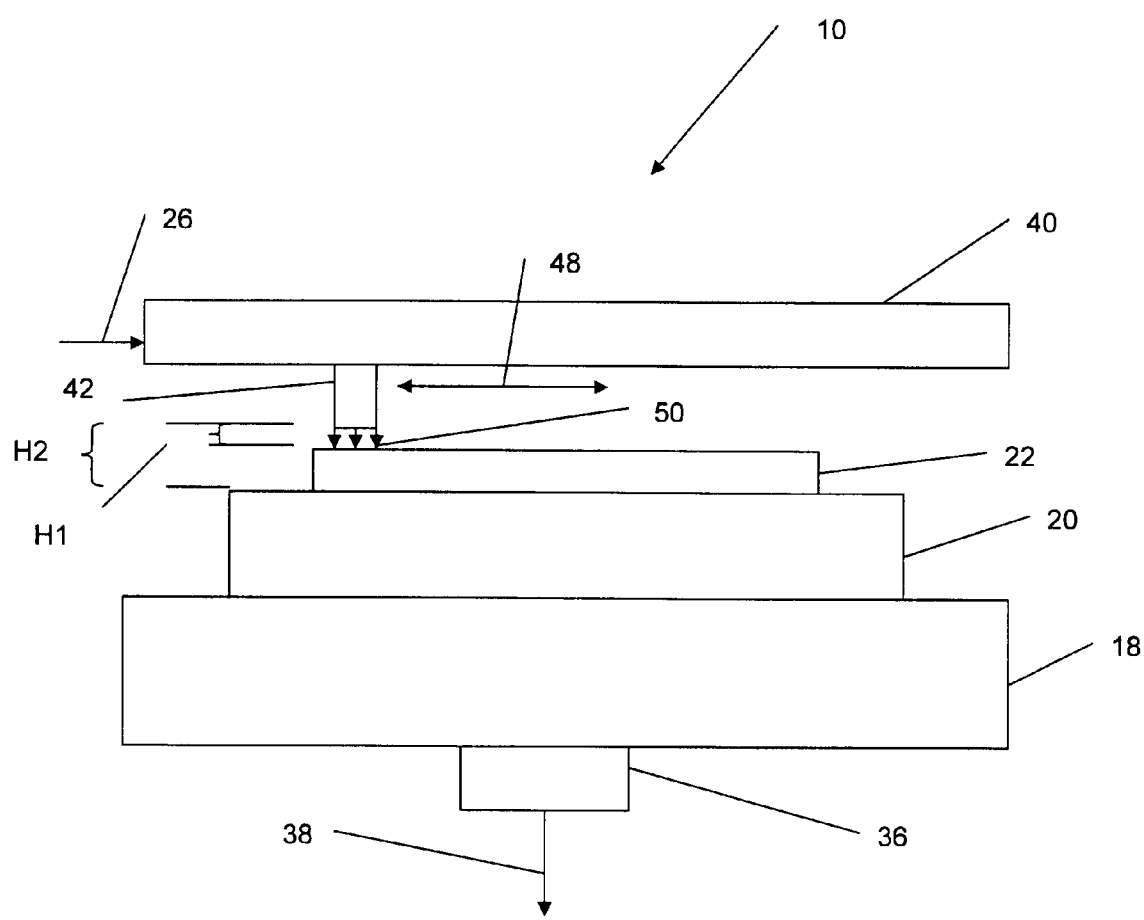
FIG. 3 is a schematic end view of the processor shown in FIG. 2.

FIG. 1 represents the basic elements of the present invention, comprising a workstation 12 and a fluid delivery system 14. The workstation 12 is shown with a pedestal or legs 16, which support a basin or tub 18. A worktable 20 is supported within and rises above the basin such that fluid deposited on and overflowing from worktable is captured by the basin. The table 20 provides a flat, rigid support surface for receiving and supporting an imaged plate 22. In this embodiment, the operator manually places the plate 22 on the table 20, develops the plate as will be described below, manually removes the plate, and then wipes or otherwise dries the plate.

The fluid delivery system 14 comprises an hydraulic pump 24 having an inlet 24a connectable to a source S of developing fluid, and an outlet 24b that discharges pressurized fluid to delivery line 26. The present invention is particularly advantageous when the developing fluid is tap water, which can be supplied at S under typical municipal water pressure of about 15 psi. However, the pump 24 can alternatively draw water at S from a sump of standing or recirculating water. The pump should increase the pressure to above 200 psi, and preferably to a pressure in the range of about 500-1500 psi.

The delivery line 26 can be a hose or similar flexible line, with a manually maneuverable wand 28, such as a pipe or the like. The wand 28 terminates in a nozzle 30, which the operator directs obliquely downwardly at the plate 22. For convenience in handling the line 26 and wand 28, the line may be routed over a roller 32 or pivoted support adjacent to and above the table 20. The high pressure fluid preferably emerges as a dense spray 50, which at a given moment, impinges on a sub area of the plate smaller than the total area of the plate. While the plate 22 is stationary on table 20, the operator moves the wand across the plate to remove the regions of low cohesion and adhesion from the substrate, while the regions of high cohesion and adhesion remain intact.

Preferably, a pressure gauge 34 is connected to the wand 28, delivery line 26, or pump outlet 24b (each of which is commensurate with a particular discharge pressure for a given nozzle) whereby the operator can through trial and error, correlate satisfactory development with the variables of discharge pressure, nozzle spray pattern, distance of the nozzle from the plate, and nozzle translation rate.

With water as the developing fluid, a suspension of coating particles in water overflows into the basin 18 and is directed to a particle filter 36. The filtrate contains no solvents or resinous material, so it can be discharged via drainpipe 38 through the floor without treatment, as municipal wastewater. Preferably, the drained, filtered liquid is recycled or recirculated as source fluid S, and indicated by the dashed line 38'.

A series of tests was performed with equipment substantially as shown in FIG. 1. A non-diazo based, photopolymerizable, solvent soluble, negative working, UV and IR sensitive coating was applied in a conventional manner to a grained and anodized aluminum substrate. The plate is available from Anocoil Corporation, Rockville, Conn., as Type N-100. The coating weight was 100 mg/ft$^2$, drawn down with a wire wound stainless steel rod, and dried for two minutes at 90° C. All plates had a topcoat of PVOH at 140 mg/ft$^2$. A first set of newspaper plates were imaged at 100 mj/cm$^2$ at IR wavelength and sprayed with tap water. A second set of identical newspaper plates were imaged with UV radiation at each of 200, 100, and 50 mj/cm$^2$. Each plate was subjected to a nozzle spray having a 30-40 deg. fan shape producing a narrow rectangular impact pattern that was about 3 to 4 inches in length and less then about ½ inch wide, at a distance of about 1 to 4 inches from the nozzle discharge orifice. Pressure in the delivery line was varied between about 200 psi up to about 1000 psi.

These tests confirmed that, with both IR and UV imaging at 1200 dpi in the commercially typical range of 75 to 150 mj/cm$^2$, tap water developer at a pressure in line 26 above 200 psi, and with the nozzle maneuvered at about 1 to 4 inches from the plate for a total development time of under one minute, excellent results were obtained.

The following table contains descriptions of representative coating constituents for UV and IR sensitive plates similar to the N-100 plates on which preliminary tests were performed and which are expected to be developed satisfactorily with the present invention.

TABLE

| Representative Coating Constituents | | | | |
|---|---|---|---|---|
| | #1 | #2 | #3 | #4 |
| Meth. Prop [a] | 92.39% | 91.99% | 92.27% | 92.40% |
| Sartomer 399 [b] | 2.31% | 2.31% | 2.31% | 1.84% |
| Clariant Poly 123 [c] | 0.46% | 0.46% | 0.46% | 0.92% |
| Triazine AC [d] | 0.45% | 0.45% | 0.45% | 0.45% |
| DTTDA [e] | 0.00% | 0.40% | 0.00% | 0.00% |
| 4-HBSA [f] | 0.00% | 0.00% | 0.12% | 0.00% |
| KF-1151 [g] | 0.05% | 0.05% | 0.05% | 0.05% |
| Pigment Disp [h] | 4.34% | 4.34% | 4.34% | 4.34% |
| | 100.0% | 100.0% | 100.0% | 100.0% |

[a] Solvent (1-Methoxy-2-Propanol, Propylene Glycol Methyl Ether available from Arco Chemical Company)
[b] Monomer (Dipentaerythritol Monohydroxypentaacrylate available from Sartomer Company, West Chester, Penn.)
[c] Polymer
[d] Initiator
[e] Solvent soluble, partially water soluble compound
[f] Release Agent
[g] Dye
[h] Pigment With reference now to FIGS. 2-5, more automated embodiments will be described. In such a system, a frame 40 or the like is situated above the plate 22 to be processed, and a spray nozzle 42 is mounted in a wand 44 that extends transversely to the plate longitudinal dimension. The plate 22 has a width W and a length L, and is continually translated longitudinally in a process direction 46. The nozzle is reciprocable transversely to the process direction between limit positions 42A and 42B, as indicated at 48, for discharging a moving spray 50. Pneumatic, hydraulic, or electric actuators or motors can readily be employed for this purpose. The plates are translated either intermittently or continuously, as by nip rolls 52, 54, at a substantially constant average speed. Distance H1 between the discharge orifice of nozzle 42 and the surface of plate 22 is an important process parameter, and for a known plate thickness can be derived from the height H2 between the nozzle orifice and the table 20.

Figure 4:
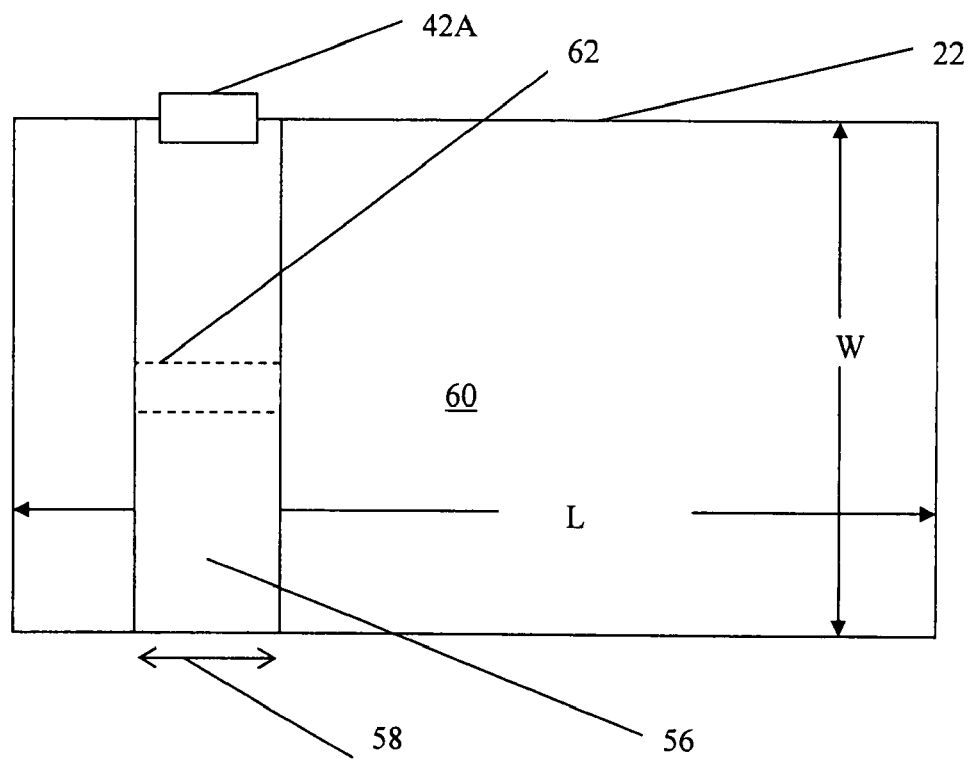
FIG. 4 is a schematic showing the movement path of a single nozzle perpendicularly to the conveying or process direction of the plate, in an embodiment wherein the plate is conveyed intermittently at intervals corresponding to the time required for the nozzle to make a complete pass across the width of the plate.
Figure 5:
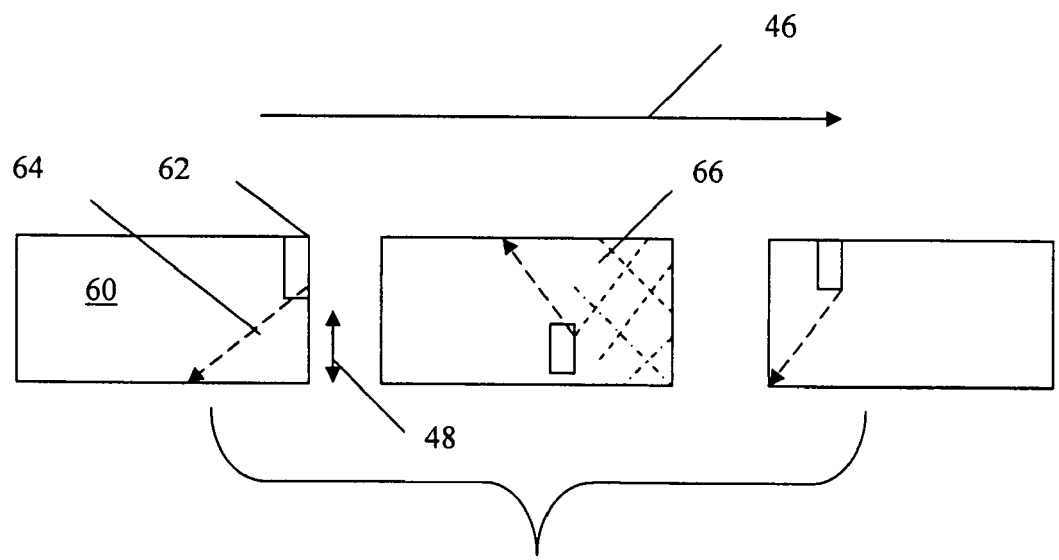
FIG. 5 is a schematic representation of another embodiment wherein the nozzle reciprocates continuously across the width of the plate and the plate is continuously conveyed beneath the nozzle, thereby producing an oblique, "zigzag" pattern of spray contact on the plate.

In the variation shown in FIG. 4, the nozzle deposits a rectangular strip 56 of water across the entire plate width while the plate is momentarily at rest, with the strip dimension 58 in the process direction of preferably 2-6 inches. The plate is then advanced an increment, and the nozzle makes an overlapping return pass, with the sequence continued until the entire plate surface 60 has been impacted by the spray. In essence, a sub area of the entire coated area 60 of the plate is continuously subjected to the instantaneous impact pattern 62 of the spray pattern 50, with such impacted area 62 appearing to move along the plate surface until the entire plate surface 60 has been developed. The impact pattern 62 would generally be 2-6 inches along the length dimension L of the plate, and less then one inch along the width dimension W of the plate.

It can be appreciated that with an alternative embodiment, a plurality of stationary nozzles 42 are arranged side-by-side in the frame 40 along the width dimension W of the plate, such that all of strip 56 is impacted simultaneously, i.e., the high pressure water impact area 62 is over the entire strip 56, which in FIG. 4 has an impacted area of length 58 and width W. The plate moves continually, with the full-width strip 56 appearing to move along length direction L In the variation shown in FIG. 5, the plate is conveyed continuously in direction 46, while the instantaneous spray impact pattern 62 is continuously reciprocated 48 across the width of the plate, thereby producing a zigzag of deposited strips over the plate 64 which successively overlap (as represented at 66) and which in the aggregate impact the entire surface 60 of the plate.

A test was performed with a prototype automated processor as represented in FIGS. 2-5, on 14 inch wide, thermally imaged (IR at about 90-100 mj/cm$^2$) newspaper plates having a coating of a type represented in the foregoing Table. The plates were conveyed at a rate of 4 ft/min. The topcoat was removed by prewashing to minimize the time required for the high pressure water stream to ablate the regions of low adhesion and cohesion. Tap water at a line pressure of 1300 psi was discharged through a nozzle at a distance H1 of about one inch above the plate, producing an impact zone length of about 2-3 inches along the conveying direction. The nozzle cycled back and forth across the width of the plate every 1.5 seconds, producing overlapping strips of spray that covered the entire plate. Development ranged from excellent in the background and highlights to good in the deepest shadows. Optimization of nozzle distance, line pressure, spray pattern, nozzle raster speed, and plate conveying speed is expected to provide excellent results from background to shadows.

Another test was performed to determine image loss as between conventional and the inventive high pressure spray process. The conventional method used a common sump type processor with brushes employing a compounded developer containing an organic solvent and surfactants.

Procedure:
1) Obtain three of the Anocoil N-100 IR and UV sensitive negative plates.
2) Use one of these plates to determine the basecoat weight prior to exposure and development.
3) Using a UV exposure frame, blanket expose (full image) the other two plates to 250 mj/cm$^2$ of UV energy.
4) After these plates have been exposed, develop one of through the sump type processor using Anocoil Type S type developer (benzyl alcohol and surfactants) and the other using a prototype high pressure water spray processor.
5) After these plates have been developed determine what the remaining basecoat weight is using the same test employed in step #2.
6) Subtract the coat weight results from step #5 from the result of step #2 in order to determine the amount of image loss related to each of the development processes.

Results:
a) Basecoat weight of unexposed/undeveloped plate—100 mg/ft$^2$
b) Image remaining after exposure and development in sump processor—91 mg/ft$^2$
c) Image remaining after exposure and development in spray processor—99 mg/ft$^2$
d) Image loss due to sump type development—9%
e) Image Loss due to spray type development—1%

This test demonstrates that the image regions of a typically imaged coating should experience almost no material loss during high pressure water spray development. In a production environment, this means that the image (oleophilic) regions of the developed plate should retain substantially more of the original coating thickness and thus will achieve a greater useful life on-press relative to conventionally developed plates.

Practitioners in the relevant field can readily appreciate that more than one nozzle can be employed to develop a given plate. For example, two nozzles can reciprocate collinearly under a single frame, each covering approximately one half the width W of a plate. Alternatively, two frames spaced apart in the process direction, each with one reciprocating nozzle, can span the width of the plate.

Similarly, one or both of the nozzle size and line pressure can be modified according to the type of plates to be processed. In general, the main operative factor is impact force of the water on the imaged coating. At relatively lower nozzle orifice discharge pressures in the range of 200-300 psi, the conveying speed should be low (e.g., about 3 ft/min) and the nozzle should be relatively close to the plate (e.g., 1 to 2 inches) such that the impact force is high but over a relatively small impact area on the plate. At a relatively higher, preferred nozzle discharge pressure in the range of 500-1000 psi, the nozzle can be farther from the plate (e.g., 2 to 4 inches) while maintaining a high impact force over a relatively larger area of the plate. At higher conveying speeds (e.g., 5 or 6 ft/min) the pressure could be up to about 1500 psi.

In a broad aspect, the pressure should be at least 200 psi, the impingement zone on the plate ¼ to 2 in$^2$, with the nozzle less than about 4 inches from the plate, and an effective plate conveyance speed of at least 2 ft/min. In a more desirable aspect, the pressure should be in the range of about 500-1000 psi, the impingement zone on the plate ½ to 2 in$^2$, with the nozzle less then about 3 inches from the plate, and an effective plate conveyance speed of 3-5 ft/min. In a very desirable aspect, the pressure should be over 1000 psi, the impingement zone on the plate up to about one square inch, with the nozzle less then about 2 inches from the plate, and an effective plate conveyance speed up to about 6 ft/min.

It should be appreciated that other hardware and process steps can be employed for generating a high pressure spray pattern of sufficient impact force, aiming the spray onto a plate, and moving one or both of the spray and plate until the entire plate surface has been covered. Not all coatings that can be developed with only high pressure water, have as yet been identified. Accordingly, the accompanying claims should not be limited to the preferred and other representative embodiments described herein.

The invention claimed is:

1. A process for developing a radiation-imaged, negative working lithographic plate having a hydrophilic substrate and an overlying solvent-soluble, non-diazo based, oleophilic, photopolymerizable resin coating in which photopolymerized image regions have cohesion and adhesion to said hydrophilic substrate and non-image regions have lower cohesion and adhesion to said hydrophilic substrate than the cohesion and adhesion in the image regions, respectively, comprising:
exposing the entire coating to a spray of water at a pressure greater than 1000 psi, whereby the water mechanically and completely removes only the non-image regions of the coating from the substrate without dissolution of any of said resin, thereby directly producing a printing plate without further irradiation, having an image pattern of oleophilic regions of said coating and hydrophilic regions of said substrate.

2. The process of claim 1, wherein
a nozzle above the imaged plate discharges a spray pattern of water that at a given moment impinges the plate on a sub area of the total coated area of the plate;
at least one of the plate and nozzle is translated relative to other in a process direction, whereby said sub area moves on the plate until all of the plate surface has been exposed to the high pressure stream of water.

3. The process of claim 2, wherein
the nozzle discharges water at a discharge pressure and the discharged water impinges the plate at a contact pressure that is commensurate with said discharge pressure;
the nozzle is spaced above the plate at a working distance; and
said translation is at a substantially constant average speed in the range of 3-6 ft/mm.

4. The process of claim 2, wherein
the plate is translated below the nozzle at a speed in the range of about 3 to 6 if/mm; and
the nozzle impinges the plate over a sub area of the total coated area of the plate, that is rastered transversely to the process direction.

5. The process of claim 4, wherein the sub area is a strip having a length in the process direction of between about 2 and 6 inches.

6. A method for developing a radiation-imaged lithographic plate having a hydrophilic substrate and an overlying oleophilic coating in which image regions have cohesion and adhesion to said hydrophilic substrate and non-image regions have lower cohesion and adhesion to said hydrophilic substrate than the cohesion and adhesion of the image regions, respectively, comprising:
selecting a plate having a non-diazo based, solvent-soluble, negative working radiation-imagable coating including (a) polymerizable resin material capable of radically cross-linking when the coating is exposed to imaging radiation, and (b) a partially water soluble compound;
imagewise exposing the plate to radiation to form an imaged plate;
exposing the entire coating to a high pressure spray of water at a pressure greater than 1000 psi, whereby the water mechanically and completely removes only the non-image regions of the coating from the substrate, without dissolution of any of the resin material thereby producing a printing plate having an image pattern of oleophilic regions of said coating and hydrophilic regions of said substrate.

7. The process of claim 1, wherein the spray of water is delivered to the plate through at least one nozzle having a discharge pressure in the range of about 1300-1500 psi.

8. The process of claim 6, wherein the spray of water is delivered to the plate through at least one nozzle having a discharge pressure in the range of about 1300-1500 psi.

* * * * *

UNITED STATES PATENT AND TRADEMARK OFFICE
CERTIFICATE OF CORRECTION

PATENT NO. : 7,700,266 B2
APPLICATION NO. : 11/821721
DATED : April 20, 2010
INVENTOR(S) : Fromson et al.

It is certified that error appears in the above-identified patent and that said Letters Patent is hereby corrected as shown below:

Column 8:
Line 19, delete "3-6 ft/mm." and substitute --3-6 ft/min.--.

Line 22, delete "3-6 ft/mm." and substitute --3-6 ft/min.--.

Signed and Sealed this

Twenty-eighth Day of September, 2010

David J. Kappos
*Director of the United States Patent and Trademark Office*